(12) United States Patent
Hsu et al.

(10) Patent No.: US 8,772,858 B2
(45) Date of Patent: Jul. 8, 2014

(54) VERTICAL CHANNEL MEMORY AND MANUFACTURING METHOD THEREOF AND OPERATING METHOD USING THE SAME

(75) Inventors: Tzu-Hsuan Hsu, Chiai County (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 644 days.

(21) Appl. No.: 11/785,322

(22) Filed: Apr. 17, 2007

(65) Prior Publication Data
US 2008/0087942 A1 Apr. 17, 2008

Related U.S. Application Data

(63) Continuation-in-part of application No. 11/545,575, filed on Oct. 11, 2006.

(51) Int. Cl.
H01L 29/66 (2006.01)

(52) U.S. Cl.
USPC .................................. 257/324; 257/E29.309

(58) Field of Classification Search
USPC .......................................... 257/324, E29.309
See application file for complete search history.

(56) References Cited

U.S. PATENT DOCUMENTS

| | | | |
|---|---|---|---|
| 4,630,086 A | 12/1986 | Sato et al. | |
| 4,959,812 A | 9/1990 | Momodomi et al. | |
| 5,270,969 A | 12/1993 | Iwahashi et al. | |
| 5,278,439 A | 1/1994 | Ma et al. | |
| 5,286,994 A | 2/1994 | Ozawa et al. | |
| 5,319,229 A | 6/1994 | Shimoji et al. | |
| 5,355,464 A | 10/1994 | Fandrich et al. | |
| 5,408,115 A | 4/1995 | Chang | |
| 5,412,603 A | 5/1995 | Schreck et al. | |
| 5,424,569 A | 6/1995 | Prall | |
| 5,448,517 A | 9/1995 | Iwahashi et al. | |
| 5,483,486 A | 1/1996 | Javanifard et al. | |
| 5,485,422 A | 1/1996 | Bauer et al. | |
| 5,509,134 A | 4/1996 | Fandrich et al. | |

(Continued)

FOREIGN PATENT DOCUMENTS

| | | |
|---|---|---|
| EP | 0016246 | 10/1980 |
| EP | 1411555 | 4/2004 |

(Continued)

OTHER PUBLICATIONS

White et al., "On the Go with SONOS" IEEE Circuits and Devices, Jul. 2000, 22-31.

(Continued)

*Primary Examiner* — Daniel Luke
*Assistant Examiner* — Latanya N Crawford
(74) *Attorney, Agent, or Firm* — Kentz Suzue; Haynes Beffel & Wolfeld LLP

(57) ABSTRACT

A vertical channel memory including a substrate, a channel, a multi-layer structure, a gate, a first terminal and a second terminal is provided. The channel protrudes from the substrate and has a top surface and two vertical surfaces. The multi-layer structure is disposed on the two vertical surfaces of the channel. The gate straddling multi-layer structure is positioned above the two vertical surfaces of the channel. The first terminal and the second terminal are respectively positioned at two sides of the channel opposing to the gate.

20 Claims, 16 Drawing Sheets

(56) References Cited

U.S. PATENT DOCUMENTS

| | | |
|---|---|---|
| 5,515,324 A | 5/1996 | Tanaka et al. |
| 5,566,120 A | 10/1996 | D'Souza |
| 5,602,775 A | 2/1997 | Vo |
| 5,644,533 A | 7/1997 | Lancaster et al. |
| 5,668,029 A | 9/1997 | Huang et al. |
| 5,694,356 A | 12/1997 | Wong et al. |
| 5,745,410 A | 4/1998 | Yiu et al. |
| 5,753,950 A | 5/1998 | Kojima et al. |
| 5,768,192 A | 6/1998 | Eitan et al. |
| RE35,838 E | 7/1998 | Momodomi et al. |
| 5,835,396 A | 11/1998 | Zhang |
| 5,877,054 A | 3/1999 | Yamauchi et al. |
| 5,883,409 A | 3/1999 | Guterman et al. |
| 5,895,949 A | 4/1999 | Endoh et al. |
| 5,952,692 A | 9/1999 | Nakazato et al. |
| 5,966,603 A | 10/1999 | Eitan et al. |
| 5,981,404 A * | 11/1999 | Sheng et al. .................. 438/791 |
| 6,011,725 A | 1/2000 | Eitan et al. |
| 6,026,026 A | 2/2000 | Chan et al. |
| 6,034,896 A | 3/2000 | Ranaweera et al. |
| 6,074,917 A | 6/2000 | Chang et al. |
| 6,096,603 A | 8/2000 | Chang et al. |
| 6,103,572 A | 8/2000 | Kirihara |
| 6,151,248 A | 11/2000 | Harari et al. |
| 6,169,693 B1 | 1/2001 | Chan et al. |
| 6,172,907 B1 | 1/2001 | Jenne |
| 6,194,272 B1 | 2/2001 | Sung et al. |
| 6,215,148 B1 | 4/2001 | Eitan |
| 6,218,700 B1 | 4/2001 | Papadas et al. |
| 6,219,276 B1 | 4/2001 | Parker |
| 6,297,096 B1 | 10/2001 | Boaz |
| 6,320,786 B1 | 11/2001 | Chang et al. |
| 6,322,903 B1 | 11/2001 | Siniaguine et al. |
| 6,356,478 B1 | 3/2002 | McCollum |
| 6,363,013 B1 | 3/2002 | Lu et al. |
| 6,396,741 B1 | 5/2002 | Bloom et al. |
| 6,436,768 B1 | 8/2002 | Yang et al. |
| 6,458,642 B1 | 10/2002 | Yeh et al. |
| 6,487,114 B2 | 11/2002 | Jong et al. |
| 6,512,696 B1 | 1/2003 | Fan et al. |
| 6,522,585 B2 | 2/2003 | Pasternak |
| 6,538,923 B1 | 3/2003 | Parker |
| 6,552,386 B1 | 4/2003 | Wu et al. |
| 6,566,699 B2 | 5/2003 | Eitan et al. |
| 6,587,903 B2 | 7/2003 | Roohparvar |
| 6,614,070 B1 | 9/2003 | Hirose et al. |
| 6,614,694 B1 | 9/2003 | Yeh et al. |
| 6,617,639 B1 | 9/2003 | Wang et al. |
| 6,642,090 B1 | 11/2003 | Fried et al. |
| 6,643,181 B2 | 11/2003 | Sofer et al. |
| 6,643,185 B1 | 11/2003 | Wang et al. |
| 6,645,813 B1 | 11/2003 | Hsieh et al. |
| 6,646,924 B1 | 11/2003 | Tsai et al. |
| 6,653,733 B1 | 11/2003 | Gonzalez et al. |
| 6,657,252 B2 | 12/2003 | Fried et al. |
| 6,657,894 B2 | 12/2003 | Yeh et al. |
| 6,670,240 B2 | 12/2003 | Ogura et al. |
| 6,670,671 B2 | 12/2003 | Sasago et al. |
| 6,674,138 B1 | 1/2004 | Halliyal et al. |
| 6,677,200 B2 | 1/2004 | Lee et al. |
| 6,690,601 B2 | 2/2004 | Yeh et al. |
| 6,709,928 B1 | 3/2004 | Jenne et al. |
| 6,714,457 B1 | 3/2004 | Hsu et al. |
| 6,720,630 B2 | 4/2004 | Mandelman et al. |
| 6,734,065 B2 | 5/2004 | Yim et al. |
| 6,744,105 B1 | 6/2004 | Chen et al. |
| 6,750,525 B2 | 6/2004 | Yim et al. |
| 6,784,480 B2 | 8/2004 | Bhattacharyya |
| 6,795,357 B1 | 9/2004 | Liu et al. |
| 6,798,012 B1 | 9/2004 | Ma et al. |
| 6,812,075 B2 | 11/2004 | Fried et al. |
| 6,815,268 B1 | 11/2004 | Yu et al. |
| 6,815,805 B2 | 11/2004 | Weimer |
| 6,818,558 B1 | 11/2004 | Rathor et al. |
| 6,828,205 B2 | 12/2004 | Tsai et al. |
| 6,829,175 B2 | 12/2004 | Tsai et al. |
| 6,841,813 B2 | 1/2005 | Walker et al. |
| 6,856,551 B2 | 2/2005 | Mokhlesi et al. |
| 6,858,899 B2 | 2/2005 | Mahajani et al. |
| 6,858,906 B2 | 2/2005 | Lee et al. |
| 6,885,044 B2 | 4/2005 | Ding |
| 6,888,750 B2 | 5/2005 | Walker et al. |
| 6,897,533 B1 | 5/2005 | Yang et al. |
| 6,912,163 B2 | 6/2005 | Zheng et al. |
| 6,924,178 B2 | 8/2005 | Beintner |
| 6,925,007 B2 | 8/2005 | Harari et al. |
| 6,933,555 B2 | 8/2005 | Hsieh et al. |
| 6,937,511 B2 | 8/2005 | Hsu et al. |
| 6,942,320 B2 | 9/2005 | Chung et al. |
| 6,970,383 B1 | 11/2005 | Han et al. |
| 6,977,201 B2 | 12/2005 | Jung et al. |
| 6,995,424 B2 | 2/2006 | Lee et al. |
| 6,996,011 B2 | 2/2006 | Yeh et al. |
| 7,005,366 B2 | 2/2006 | Chau et al. |
| 7,012,297 B2 | 3/2006 | Bhattacharyya |
| 7,018,895 B2 | 3/2006 | Ding |
| 7,026,682 B2 | 4/2006 | Chung et al. |
| 7,042,045 B2 | 5/2006 | Kang et al. |
| 7,057,234 B2 | 6/2006 | Tiwari |
| 7,071,061 B1 | 7/2006 | Pittikoun et al. |
| 7,075,828 B2 | 7/2006 | Lue et al. |
| 7,106,625 B2 | 9/2006 | Yeh et al. |
| 7,115,469 B1 | 10/2006 | Halliyal et al. |
| 7,115,942 B2 | 10/2006 | Wang |
| 7,120,059 B2 | 10/2006 | Yeh et al. |
| 7,129,538 B2 | 10/2006 | Lee et al. |
| 7,133,313 B2 | 11/2006 | Shih et al. |
| 7,133,317 B2 | 11/2006 | Liao et al. |
| 7,135,734 B2 | 11/2006 | Eldridge et al. |
| 7,151,692 B2 | 12/2006 | Wu et al. |
| 7,154,143 B2 | 12/2006 | Jung et al. |
| 7,154,779 B2 | 12/2006 | Mokhlesi et al. |
| 7,157,769 B2 | 1/2007 | Forbes |
| 7,158,420 B2 | 1/2007 | Lung |
| 7,164,603 B2 | 1/2007 | Shih et al. |
| 7,166,513 B2 | 1/2007 | Hsu et al. |
| 7,187,590 B2 | 3/2007 | Zous et al. |
| 7,190,614 B2 | 3/2007 | Wu et al. |
| 7,209,386 B2 | 4/2007 | Yeh et al. |
| 7,209,389 B2 | 4/2007 | Lung et al. |
| 7,209,390 B2 | 4/2007 | Lue et al. |
| 7,242,622 B2 | 7/2007 | Hsu et al. |
| 7,250,646 B2 | 7/2007 | Walker et al. |
| 7,262,084 B2 | 8/2007 | Zhu et al. |
| 7,279,740 B2 | 10/2007 | Bhattacharyya et al. |
| 7,298,004 B2 * | 11/2007 | Specht et al. .................. 257/315 |
| 7,314,787 B2 | 1/2008 | Yagishita et al. |
| 7,473,967 B2 * | 1/2009 | Sorada et al. .................. 257/347 |
| 7,811,890 B2 | 10/2010 | Hsu et al. |
| 2001/0012663 A1 | 8/2001 | Magri' et al. |
| 2001/0045615 A1 | 11/2001 | Ajit |
| 2001/0055838 A1 | 12/2001 | Walker et al. |
| 2002/0142252 A1 | 10/2002 | Ng |
| 2002/0167844 A1 | 11/2002 | Han et al. |
| 2002/0179958 A1 | 12/2002 | Kim |
| 2003/0023603 A1 | 1/2003 | Ellison et al. |
| 2003/0025147 A1 | 2/2003 | Nomoto et al. |
| 2003/0030100 A1 | 2/2003 | Lee et al. |
| 2003/0032242 A1 | 2/2003 | Lee et al. |
| 2003/0036250 A1 | 2/2003 | Lin et al. |
| 2003/0042534 A1 | 3/2003 | Bhattacharyya |
| 2003/0047755 A1 | 3/2003 | Lee et al. |
| 2003/0067032 A1 | 4/2003 | Caprara et al. |
| 2003/0146465 A1 | 8/2003 | Wu |
| 2003/0185055 A1 | 10/2003 | Yeh et al. |
| 2003/0224564 A1 | 12/2003 | Kang et al. |
| 2003/0232507 A1 | 12/2003 | Chen |
| 2004/0007738 A1 * | 1/2004 | Fried et al. .................. 257/329 |
| 2004/0079983 A1 | 4/2004 | Chae et al. |
| 2004/0084714 A1 | 5/2004 | Ishii et al. |
| 2004/0125629 A1 | 7/2004 | Scheuerlein et al. |
| 2004/0145024 A1 | 7/2004 | Chen et al. |
| 2004/0150029 A1 * | 8/2004 | Lee .................. 257/308 |
| 2004/0159910 A1 | 8/2004 | Fried et al. |

(56) References Cited

U.S. PATENT DOCUMENTS

| | | | |
|---|---|---|---|
| 2004/0183126 A1 | 9/2004 | Bae et al. | |
| 2004/0207002 A1* | 10/2004 | Ryu et al. | 257/315 |
| 2004/0251487 A1 | 12/2004 | Wu et al. | |
| 2004/0256679 A1 | 12/2004 | Hu | |
| 2005/0001258 A1 | 1/2005 | Forbes | |
| 2005/0006696 A1* | 1/2005 | Noguchi et al. | 257/316 |
| 2005/0023603 A1 | 2/2005 | Eldridge et al. | |
| 2005/0062091 A1 | 3/2005 | Ding | |
| 2005/0062098 A1* | 3/2005 | Mahajani et al. | 257/324 |
| 2005/0074937 A1 | 4/2005 | Jung | |
| 2005/0093054 A1 | 5/2005 | Jung | |
| 2005/0218522 A1 | 10/2005 | Nomoto et al. | |
| 2005/0219906 A1 | 10/2005 | Wu | |
| 2005/0226047 A1* | 10/2005 | Hieda et al. | 365/185.14 |
| 2005/0227435 A1 | 10/2005 | Oh et al. | |
| 2005/0237801 A1 | 10/2005 | Shih | |
| 2005/0237809 A1 | 10/2005 | Shih et al. | |
| 2005/0237813 A1 | 10/2005 | Zous et al. | |
| 2005/0237815 A1 | 10/2005 | Lue et al. | |
| 2005/0237816 A1 | 10/2005 | Lue et al. | |
| 2005/0255652 A1 | 11/2005 | Nomoto et al. | |
| 2005/0266638 A1* | 12/2005 | Cho et al. | 438/257 |
| 2005/0270849 A1 | 12/2005 | Lue | |
| 2005/0272190 A1* | 12/2005 | Lee et al. | 438/176 |
| 2005/0281085 A1 | 12/2005 | Wu | |
| 2006/0007732 A1 | 1/2006 | Yeh | |
| 2006/0029887 A1* | 2/2006 | Oh et al. | 430/311 |
| 2006/0044872 A1 | 3/2006 | Nazarian | |
| 2006/0088983 A1 | 4/2006 | Fujisawa et al. | |
| 2006/0097310 A1* | 5/2006 | Kim et al. | 257/321 |
| 2006/0115978 A1* | 6/2006 | Specht et al. | 438/637 |
| 2006/0197145 A1 | 9/2006 | Pittikoun et al. | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202256 A1 | 9/2006 | Harari | |
| 2006/0202261 A1* | 9/2006 | Lue et al. | 257/324 |
| 2006/0234446 A1 | 10/2006 | Wei et al. | |
| 2006/0258090 A1 | 11/2006 | Bhattacharyya et al. | |
| 2006/0261401 A1 | 11/2006 | Bhattacharyya | |
| 2006/0275986 A1 | 12/2006 | Kobayashi et al. | |
| 2006/0281260 A1 | 12/2006 | Lue | |
| 2006/0284245 A1* | 12/2006 | Park et al. | 257/324 |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0032018 A1 | 2/2007 | Tuntasood et al. | |
| 2007/0045718 A1 | 3/2007 | Bhattacharyya | |
| 2007/0069283 A1 | 3/2007 | Shih et al. | |
| 2007/0076477 A1 | 4/2007 | Hwang et al. | |
| 2007/0096202 A1 | 5/2007 | Kang et al. | |
| 2007/0138539 A1 | 6/2007 | Wu et al. | |
| 2007/0258289 A1 | 11/2007 | Lue | |
| 2007/0284620 A1 | 12/2007 | Lue et al. | |
| 2008/0057644 A1* | 3/2008 | Kwak et al. | 438/257 |
| 2008/0099830 A1* | 5/2008 | Lue et al. | 257/324 |
| 2008/0150029 A1* | 6/2008 | Zheng et al. | 257/365 |
| 2008/0265308 A1 | 10/2008 | Lee | |
| 2010/0176438 A1* | 7/2010 | Lue et al. | 257/324 |

FOREIGN PATENT DOCUMENTS

| | | |
|---|---|---|
| EP | 1689002 | 8/2006 |
| JP | 09162313 | 6/1997 |
| JP | 11040682 | 2/1999 |
| JP | 11233653 | 8/1999 |
| JP | 2004363329 | 12/2004 |
| WO | WO-9428551 A1 | 12/1994 |
| WO | WO-0137347 | 5/2001 |

OTHER PUBLICATIONS

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38(11) Nov. 1991 2519-2526.

Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

DiMaria, D.J., et al., "Conduction Studies in Silicon Nitride: Dark Currents and Photocurrents," IBM J. Res. Dev. May 1977, 227-244.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin $HfO_2$ ($ZrO_2$) layers sandwiched between thicker $SiO_2$ Layers," Surface Science Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Shih et al., "A Novel 2-bit/cell Nitride Storage Flash memory with Greater than 1M P/E-cycle Endurance," IEEE IEDM 2004, pp. 36.3.1-36.3.4.

Govoreanu et al., "Simulation of Nanofloating Gate Memory with High-k Stacked Dielectrics," IEEE SISPAD Int'l Conf. 305 Sep. 2003, 299-302.

Kim et al., "Robust Multi-bit Programmable Flash Memory Using a Resonant Tunnel Barrier," Electron Dev. Mtg. Dec. 5-7, 2005, IEDM Tech Dig. 861-864.

Lue et al., "BE-SONOS: A Bandgap Engineered SONOS with Excellent Performance and Reliability," IEDM Tech Digest, IEEE Int'l Dec. 2005, 547-550.

Sung, et al., "Multi-layer SONOS with Direct Tunnel Oxide for High Speed and Long Retention Time," IEEE 2002 Nanoelectronics Workshop, Jun. 2002, 83-84.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

Tsai et al., "Novel SONOS-Type Nonvolatile Memory Device with Suitable Band Offset in HfAIO Charge-Trapping Layer," Int'l Symp. on VLSI Tech, Systems and Applications, Apr. 23-25, 2007, 2 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Yeh, C.C., et al., "PHINES: A Novel Low Power Program/Erase, Small Pitch, 2-Bit per Cell Flash Memory," IEDM Tech. Dig. 2002, 931-934.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6..4.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

(56) References Cited

OTHER PUBLICATIONS

Lee, Chang, et al., "A Novel SONOS Structure of SiO2/SiN/Al2O3 with TaN Metal Gate for Multi-Giga Bit Flash Memeries," IEEE 2003 4 pages.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Maikap, S., et al., "High-k HfO2/TiO2/HfO2 multilayer quantum well flash memory devices," Int'l Symp on VLSI Technology, Sytems and Applications Apr. 23-25, 2007, pp. 1-2.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Wen, Huang-Chun, et al., "Issues associated with p-type band-edge effective work function metal electrodes: Fermi-level pinning and flatband roll-off," Int'l Symp on VLSI Technology, Systems and Applications, Apr. 23-25, 2007, pp. 1-2.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Materials Reliability 4(3), Sep. 2004 345-351.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Likharev, "Layered Tunnel Barriers for Nonvolatile Memory Devices," Appl. Phys. Lett. 73(15) Oct. 1998 2137-2139.

Aminzadeh et al., "Conduction and Charge Trapping in Polysilicon-Silicon Nitride—Oxide—Silicon Structures under Positive Gate Bias," IEEE Trans. on Electron Dev. 35(4) Apr. 1998 459-467.

Sasago, Y. et al., "90-nm-node multi-level AG-AND type flash memory with cell size of true 2 F/sup 2//bit and programming throughput of 10 MB/s," IEDM, 2003, pp. 823-826.

Fujiwara, I., et al., "0.13 µm MONOS single transistor memory cell with deparated source lines," IEDM 1998, 995-998.

Chang, Kuo-Tung, et al., "A New SONOS Memory Using Source-Side Injection for Programming," IEEE Electron Device Letters, vol. 19, No. 7, Jul. 1998, 253-255.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Naruke, K., et al., "Nonvolatile Semiconductor Memories: Technologies, design and application," C. Hu. Ed., New York, IEEE Press, 1991, Ch. 5, pp. 183-186.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

Lee, Jae-Duk, et al., "Effects of Floating-Gate Interference on NAND Flash Memory Cell Operation," IEEE Electron Device Letters, vol. 23, No. 5, May 2002, 264-266.

Shin, Yoocheol, et al., "High Reliable SONOS-type NAND Flash Memory Cell with Al203 for Top Oxide," Non-Volatile Semiconductor Memory Workshop, 2003, 2 pages.

Hsu, Tzu-Hsuan, et al., "A High-Speed BE-SONOS NAND Flash Utilizing the Field-Enhancement Effect of FinFET," IEEE IEDM, Dec. 10-12, 2007, 4 pages.

Lue, Hang-Ting, et al., "Study of Local Trapping and STI Edge Effects on Charge-Trapping NAND Flash," IEEE IEDM Dec. 10-12, 2007, 4 pages.

Office Action Mailed Apr. 15, 2009 in U.S. Appl. No. 11/545,575 entitled "Vertical Channel Transistor Structure and Manufacturing Method Therof," 29 pages.

Response to Office Action in U.S. Appl. No. 11/545,575 filed on Sep. 1, 2009, 17 pages.

Aminzadeh et al., "Conduction and Charge Trapping in Polysilicon-Silicon Nitride—Oxide—Silicon Structures under Positive Gate Bias," IEEE Trans. on Electron Dev. 35 (4) Apr. 1998, 459-467.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Huff, H.R. and Bevan, M., assemblers, "Questions at the International Workshop on Gate Insulators," Ad Hoc Meeting on High-k Gate Dielectricsat the Semiconductor Interface Specialists Conference, Nov. 30, 2001, 3 pages.

Hwang, Kiunn-Ren, et al., "20nm Gate Bulk-FinFET SONOS Flash," IEEE 2005, 4 pages.

Lusky, Eli et al., "Electron Discharge Model of Locally-Trapped Charge in Oxide—Nitride—Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.

Park, Chang Seo, et al., "Substituted Aluminum Metal Gate on High-K Dielectric for Low Work-Function and Fermi-Level Pinning Free," IEEE IEDM 2004, 12.4.1-12.4.4.

Rippard, W.H., et al., "Ultrathin Aluminum Oxide Tunnel Barriers," Phys. Rev. Lett. 88(4), Jan. 28, 2002, 4 pages.

Specht, M, et al. "Novel Dual Bit Tri-Gate Charge Trapping Memory Devices," IEEE IEDM 25(12), Dec. 2004, 3 pages.

Jung et al., "Dependence of Charge Trapping and Tunneling on the Silicon—Nitride (Si3N4) Thickness for Tunnel Barrier Engineered Nonvolatile Memory Applications," Applied Physics Letters 94, 053508 (2009).

\* cited by examiner

VERTICAL CHANNEL MEMORY AND MANUFACTURING METHOD THEREOF AND OPERATING METHOD USING THE SAME

This is a continuation-in-part application of application Ser. No. 11/545,575, filed Oct. 11, 2006.

BACKGROUND OF THE INVENTION

1. Field of the Invention

The invention relates in general to a vertical channel memory, to a manufacturing method thereof therefor and to an operating method using the same. More particularly the invention relates to a vertical channel memory with high scalability, to a manufacturing method therefor and to an operating method using the same.

2. Description of the Related Art

Along with the advance in manufacturing technology for semiconductor devices, the resolution of current semiconductor elements has reached nano levels. Take the memory for example, the length of the gate and the element pitch are further reduced. With sizes near the resolution limits of lithography, the manufactured transistor element still has the problems of electrostatic discharge (ESD), leakage, and reduction in electron mobility, and is apt to short channel effect and drain induced barrier lowering (DIBL) effect. Therefore, the double-gate vertical channel transistor and the tri-gate vertical channel transistor capable of providing higher packing density, better carrier transport and device scalability, such as fin field effect transistor (FinFET), have become transistor structures with great potential.

The FinFET has a vertical channel, and can form channels on two vertical surfaces and control the connection of current by double-gate or tri-gate structures, hence having better efficiency than conventional planar channel transistors.

The manufacturing of FinFET elements with high resolution still requires expensive and advanced manufacturing processes by photolithography or E-beam. However, the throughput of these advanced manufacturing processes is difficult to increase and is disadvantageous to large-scale production. One of the present manufacturing methods is etching a channel first and then the line width of the channel is reduced by oxidation. However, the element formed according to such method has poor uniformity and the quality is difficult to control.

SUMMARY OF THE INVENTION

The invention is directed to a vertical channel memory, a manufacturing method therefor and an operating method using the same. A vertical channel transistor structure whose channel width ranges between 10 nm~60 nm is manufactured without changing the pitch of the element formed by exposure. The invention effectively increases the driving current during programming or reading without incurring short channel effect or DIBL effect. The FinFET transistor formed thereby has small dimension, hence increasing memory density significantly. Furthermore, the invention provides an SONOS memory with band gap engineered structure, so-called BE-SONOS memory. Compared with the conventional vertical channel memory with SONOS structure, the vertical channel memory with BE-SONOS structure has faster operating speed and wider operating window. The vertical channel memory with BE-SONOS structure can locally trap charge and can enlarge the range of the operating window to achieve multi-level cell MLC memory.

According to a first aspect of the present invention, a vertical channel memory including a substrate, a channel, a cap layer, a charge storage layer, a first terminal and a second terminal is provided. The channel protrudes from the substrate and has a top surface and two vertical surfaces. The cap layer disposed on the channel substantially has the same width with the channel. The charge storage layer is disposed on the cap layer and the two vertical surfaces of the channel. The gate straddling the charge storage layer is positioned at the two vertical surfaces of the channel. The first terminal and the second terminal are respectively positioned at two sides of the channel opposing to the gate.

According to a second aspect of the present invention, a manufacturing method of vertical channel memory is provided. First, a substrate is provided. Next, a first nitride layer is formed on the substrate. Then, the first nitride layer is etched to form a first patterned nitride layer. Next, the first patterned nitride layer is trimmed to form a second patterned nitride layer. Then, the substrate is etched to form at least a channel protruding from the substrate. Next, a thick oxide layer is formed on a top surface of the substrate. Then, an oxide-nitride-oxide (ONO) layer is formed on the two vertical surfaces of the channel. Next, a gate material layer is formed on the ONO layer. Then, the gate material layer is etched to form at least a gate, wherein the gate is positioned on the two vertical surfaces of the channel such that fin gate is formed on a protruding fin structure of the vertical channel memory. Next, ions are injected on the two sides of the channel opposite to the gate to form a first terminal and a second terminal.

According to a third aspect of the present invention, a vertical channel memory including the substrate, a channel, a multi-layer structure, a gate, a first terminal and a second terminal is provided. The channel protrudes from the substrate and has a top surface and two vertical surfaces. The multi-layer structure is disposed on the two vertical surfaces of the channel. The gate straddling the multi-layer structure is positioned above the two vertical surfaces of the channel. The first terminal and the second terminal are respectively positioned at two sides of the channel opposing to the gate.

According to a fourth aspect of the present invention, a manufacturing method of vertical channel memory is provided. The manufacturing method includes following steps. First, a substrate is provided. Next, a first nitride layer is formed on the substrate. Then, the first nitride layer is etched to form a first patterned nitride layer. Next, the first patterned nitride layer is trimmed to form a second patterned nitride layer. Then, the substrate is etched to form at least a channel protruding from the substrate, wherein the channel has a top surface and two vertical surfaces. Next, a thick oxide layer is formed on the top surface of the substrate. Then, an ONONO layer is formed on the two vertical surfaces of the channel. Then, a gate material layer is formed on the ONONO layer. Next, the gate material layer is etched to form at least a gate positioned above the two vertical surfaces of the channel. Then, ions are injected on the two sides of the channel opposite to the gate so as to form a first terminal and a second terminal.

According to a fifth aspect of the present invention, an operating method of memory is provided. The operating method is used in a vertical channel memory. The vertical channel memory has a channel protruding from a substrate. The channel has a top surface and two vertical surfaces. The ONONO layer is disposed on the channel. The gate straddling ONONO layer is positioned above the two vertical surfaces of the channel. A first terminal and a second terminal are respectively opposite to the gate and positioned at the two sides of the channel. The operating method includes the following steps. First, a first bias-voltage is applied to the gate to program the vertical channel memory. Next, a second bias-voltage whose polarity is opposite to that of the first bias-voltage is applied to the gate so as to erase the vertical channel memory.

The invention will become apparent from the following detailed description of the preferred but non-limiting embodiments. The following description is made with reference to the accompanying drawings.

DETAILED DESCRIPTION OF THE INVENTION

First Embodiment

Figure 1A:
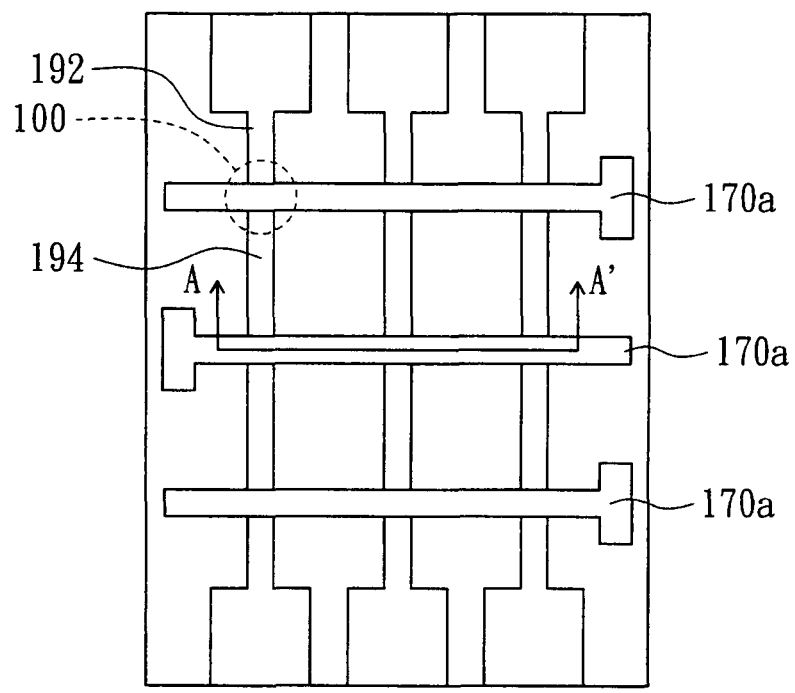
FIG. 1A is a top view of a vertical channel memory according to a first embodiment of the invention.
Figure 1B:
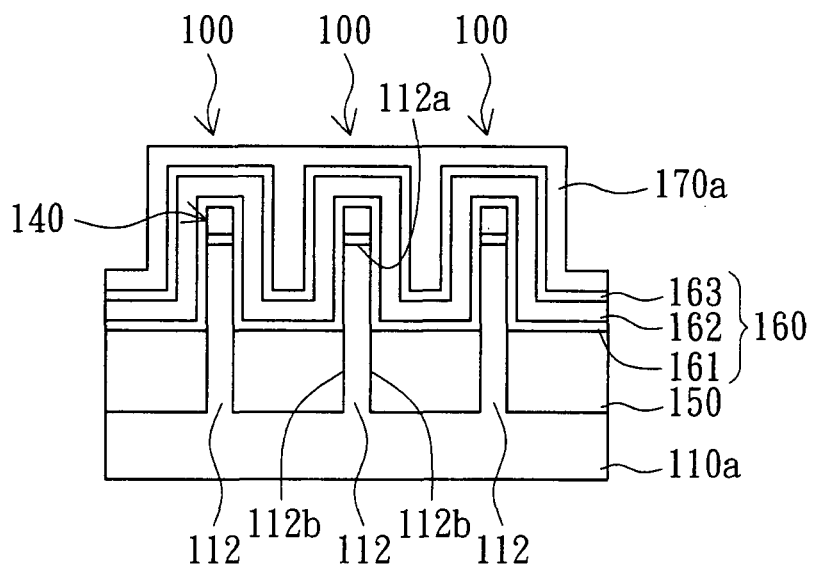
FIG. 1B is a cross-sectional view along a cross-sectional line AA' of FIG. 1A.

Referring to FIG. 1A and FIG. 1B. FIG. 1A is a top view of a vertical channel memory according to a first embodiment of the invention. FIG. 1B is a cross-sectional view along a cross-sectional line AA' of FIG. 1A. As indicated in FIG. 1B, the vertical channel memory 100 includes a substrate 110a, a channel 112 protruding from the substrate 110a and a cap layer 140 disposed on the channel 112. The channel 112 has a top surface 112a and two vertical surfaces 112b. The channel 112 substantially has the same width as that of the cap layer 140. In the present embodiment of the invention, the cap layer 140, an intermediate product during the manufacturing process, includes a silicon dioxide (SiO2) layer and a silicon nitride (SiN) layer, wherein the silicon nitride layer is positioned on the silicon dioxide layer. The cap layer 140 with appropriate thickness avoids the electron penetrating from the gate, therefore avails the formation of a dual channel vertical memory, makes the electrical field of the channel 112 more uniform, and prevents the channel 112 from generating leakage current. The oxide-nitride-oxide (ONO) layer 160 is disposed on two vertical surfaces 112b of the channel 112 and includes an oxide layer 161, a nitride layer 162 and an oxide layer 163, wherein the oxide layer 161 and the oxide layer 163 contain the nitride layer 162. The ONO layer 160 is disposed on the cap layer 140, and straddles over the fin structure of the channel 112. The oxide layer 161 and the oxide layer 163 are made from silicon oxide. The nitride layer 162 is a charge trapping layer, and is made from silicon nitride in the present embodiment of the invention. Furthermore, the charge-trapping layer (nitride layer 162) can also be made from aluminum oxide ($Al_2O_3$) or other materials with a high dielectric constant. The ONO layer 160 is a charge storage structure for enabling the vertical channel memory 100 to have the function of programming and erasing data. The gate 170a straddles the nitride layer 162, that is, the gate 170a is positioned on the fin structure of the channel 112. Due to the two vertical surfaces of the channel 112 capable of respectively controlling the connection of the current by the gate 170a, the vertical channel memory 100 is called the double-gate structure. The gate 170a can be made from N+ polysilicon, P+ polysilicon, or metal. As indicated in FIG. 1A, the first terminal 192 and the second terminal 194 are respectively positioned at the two sides of the channel 112 opposite to the gate 170a. The present embodiment of the invention is exemplified by an NAND array memory structure, the first terminal 192 and the second terminal 194 are respectively a source and a drain or a drain and a source, and the source and the drain between any two vertical channel memories 100 are a common source and a common drain. The line width of the channel 112 approximately ranges between 10 nm-60 nm.

Besides, as indicated in FIG. 1B, the vertical channel memory 100 further includes a thick oxide layer 150 positioned on the substrate 110a. In the present embodiment of the invention, the thick oxide layer 150 is made from silicon oxide. The thick oxide layer 150 avoids the substrate 110a being electrically connected, hence generating leakage current.

The application of the present embodiment of the invention is exemplified below by the manufacturing process of the NAND. Referring to FIGS. 2A~2J, perspectives illustrating the manufacturing process of the vertical channel memory according to the first embodiment of the invention are shown. Also referring to FIG. 3, a flowchart illustrating the manufacturing steps of the vertical channel memory according to the first embodiment of the invention is shown.

Figure 2A:
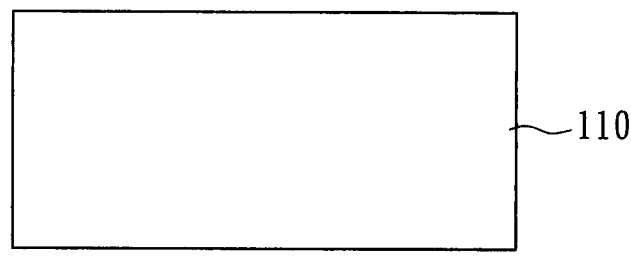
FIGS. 2A-2J illustrate the manufacturing process of the vertical channel memory according to the first embodiment of the invention.
Figure 3:
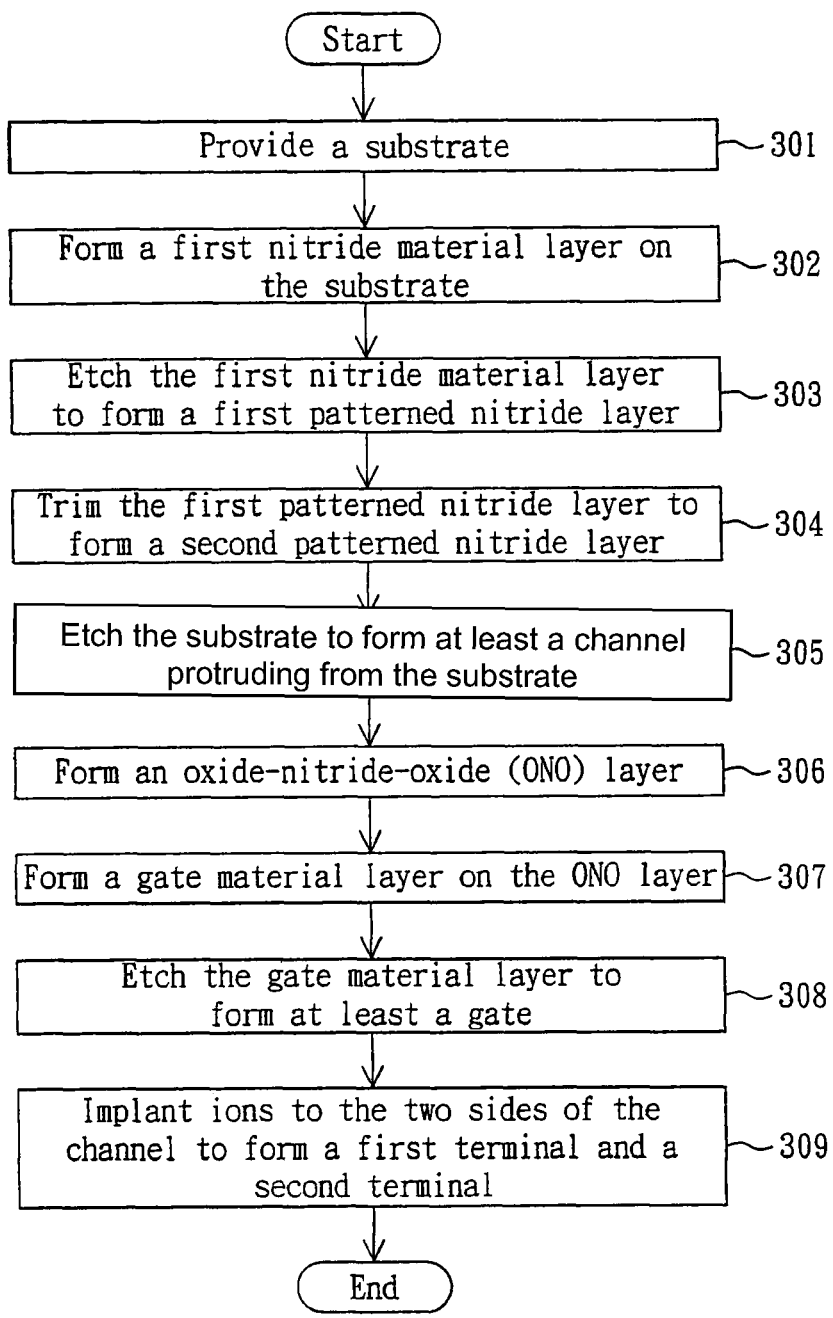
FIG. 3 is a flowchart illustrating the manufacturing steps of the vertical channel memory according to the first embodiment of the invention.

First, referring to FIG. 2A. As indicated in step 301, a substrate 110 is provided. Examples of the substrate 110 include bulk silicon substrate or silicon on insulator (SOI) substrate.

Figure 2B:
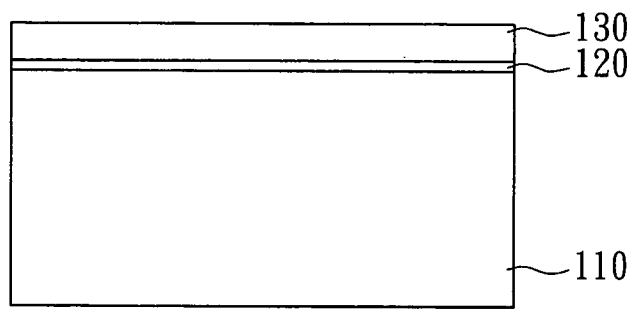

Next, referring to FIG. 2B. As indicated in step 302, a first nitride layer 130 is formed on the substrate 110. In the present embodiment of the invention, the first nitride layer 130 is made from silicon nitride, and preferably, a pad oxide layer 120 formed between the substrate 110 and the first nitride layer 130 is made from silicon oxide. Furthermore, a transistor with N-type channel is formed in the present embodiment of the invention, so P-type ions can be implanted to the substrate 100 in the current step, such that the substrate 100 has better quality when forming a channel in subsequent process. However, the present embodiment of the invention is not limited thereto. If the transistor is designed to have P-type channel, then N-type ions are implanted to the substrate 100.

Figure 2C:
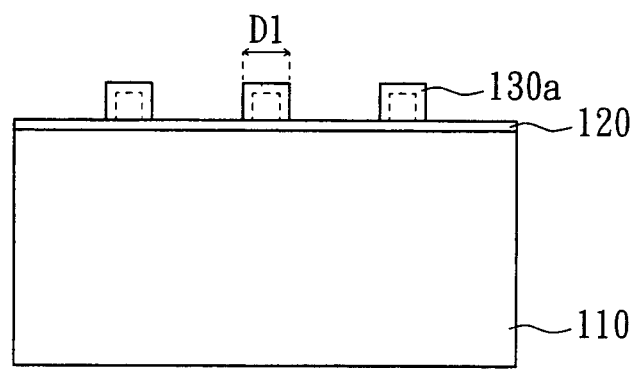

Then, referring to FIG. 2C. As indicated in step 303, the first nitride layer 130 is etched to form a first patterned nitride layer 130a. In the present embodiment of the invention, the first nitride layer 130 is made from silicon nitride. Step 303 includes the following substeps. First, a first patterned photoresist layer (not illustrated) is formed on the first nitride layer 130. Next, the first nitride layer 130 is etched to form the first patterned nitride layer 130a. Then, the first patterned photoresist layer is removed. The resulting first patterned nitride layer 130a has a pattern with line width D1. The current step can adopt the reactive ion etching (RIE) method.

Figure 2D:
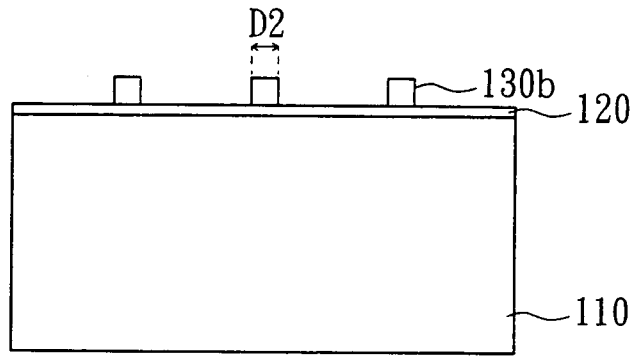

Next, referring to FIG. 2D. As indicated in step 304, the first patterned nitride layer 130a is trimmed to form a second patterned nitride layer 130b. The resulted second patterned nitride layer 130b after trimming has a pattern with line width D2. The line width D2 approximately ranges between 10 nm-60 nm. Hot-phosphoric-acid (HDP), having excellent etching selectivity with respect to silicon nitride and silicon oxide, is used to trim the first patterned nitride layer 130a in the current step. Pad areas 192a having widths of about D1 (greater than D2) are left on ends of the lines, as shown in FIG. 2J, self centered as a result of this pattern trim process.

Figure 2E:
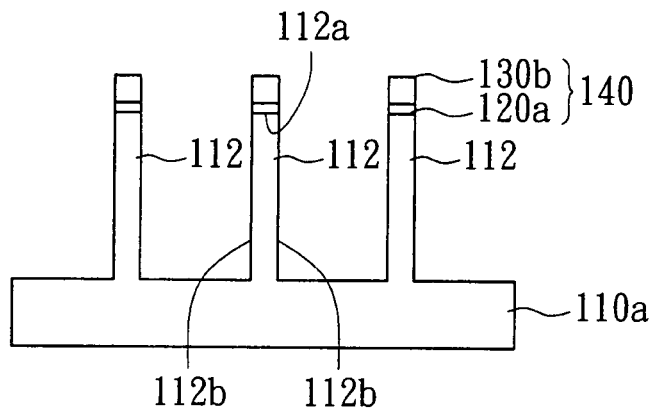

Then, referring to FIG. 2E. As indicated in step 305, the substrate 110 is etched to form a substrate 110a, and a channel 112 protruding from the substrate 110a is formed on the substrate 110a. The channel 112 has a top surface 112a and two vertical surfaces 112b. In the present embodiment of the invention, preferably after the pad oxide layer 120 is etched to form pad oxide layer 120a according to the RIE method, the substrate 110 is subsequently etched to form a channel 112. Meanwhile, the pad oxide layer 120a and the second patterned nitride layer 130b as a whole are called a cap layer 140.

Figure 2F:
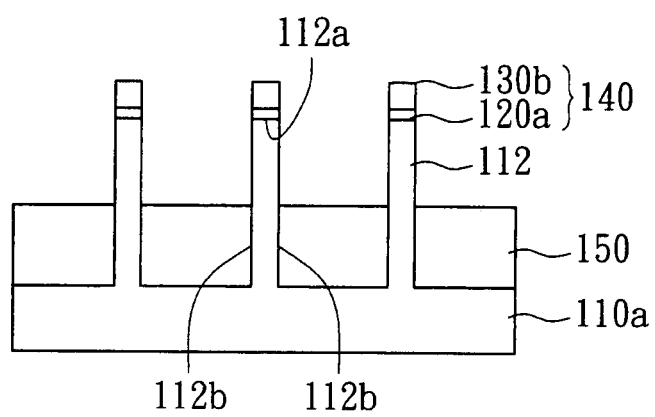

Next, referring to FIG. 2F. A thick oxide layer 150 contacting two vertical surfaces 112b of the channel 112 is formed. In the current step, the thick oxide layer 150 is deposited by high density plasma (HDP) deposition. The thick oxide layer 150 restricts the height of the fin channel, such that the current only flows through the portion of the channel 112 above the thick oxide layer 150.

Figure 2G:
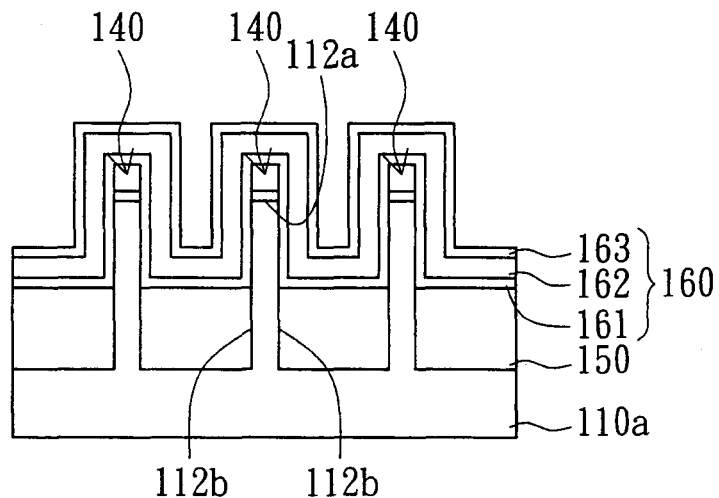

Then, referring to FIG. 2G. As indicated in step 306, an oxide-nitride-oxide (ONO) layer 160 is formed. The ONO layer 160 is disposed on the cap layer 140 and two vertical surfaces 112b of the channel 112 and the thick oxide layer 150. The ONO layer 160 includes an oxide layer 161, a nitride layer 162 and an oxide layer 163. In the present embodiment of the invention, the nitride layer 162 uses silicon nitride as the charge trapping layer. However, the charge-trapping layer (nitride layer 162) can also use aluminum oxide ($Al_2O_3$) or other materials with high dielectric constant.

Figure 2H:
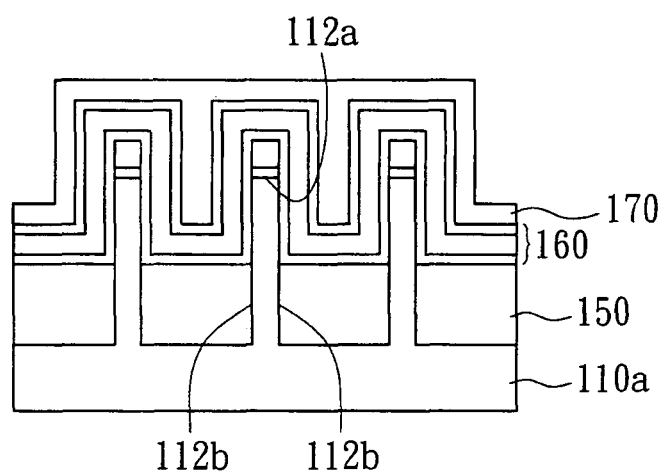

Next, referring to FIG. 2H. As indicated in step 307, a gate material layer 170 is formed on the ONO layer 160.

Figure 2I:
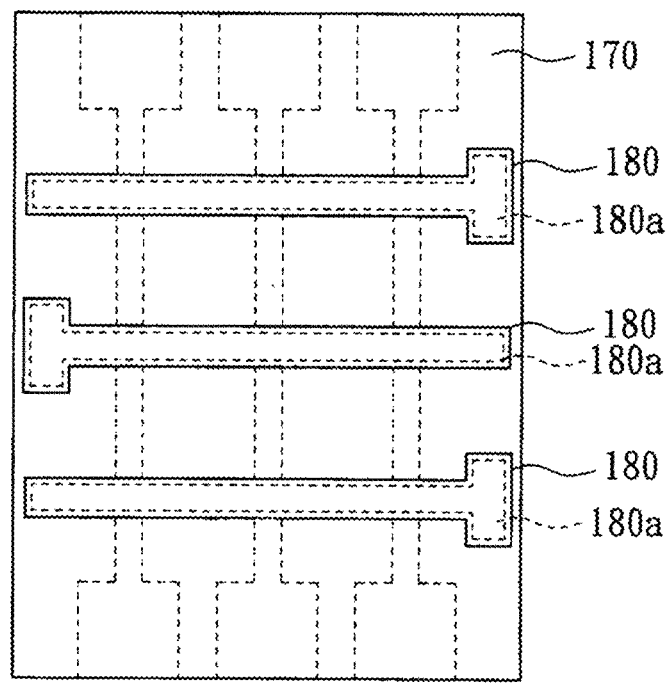
Figure 2J:
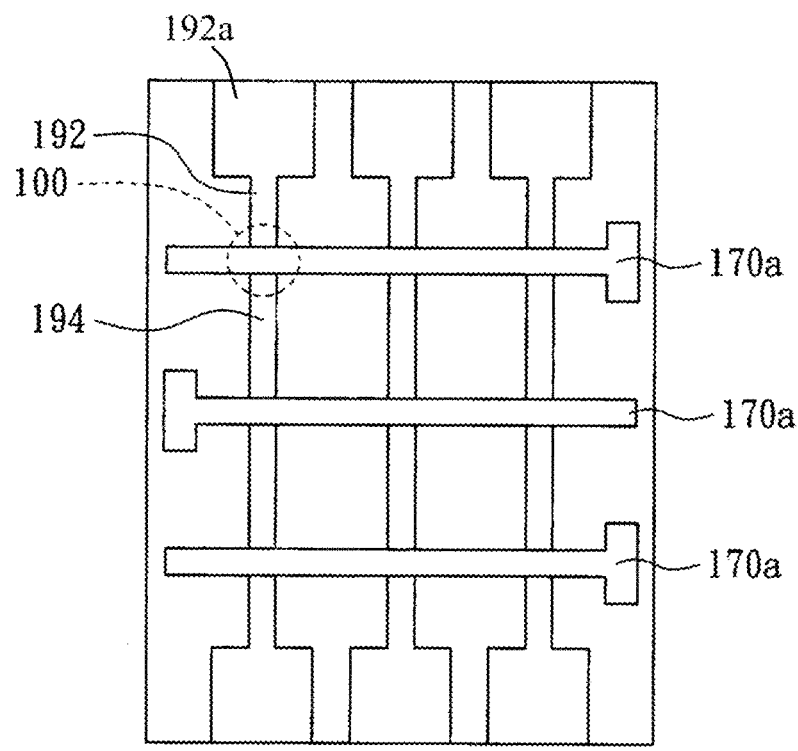

Then, referring to FIG. 2I. As indicated in step 308, the gate material layer 170 is etched to form at least a gate straddling over the fin structure of the channel 112. Before step 308 is performed, preferably the following substeps are performed. First, a second nitride layer (not illustrated) is formed on the gate material layer 170. In the present embodiment of the invention, the second nitride layer is made from silicon nitride. Next, a second patterned photo-resist layer (not illustrated) is formed on the second nitride layer. Then, the second nitride layer is etched to form a third patterned nitride layer 180. Next, the second patterned photo-resist layer is removed. Then, the third patterned nitride layer 180 is trimmed to form a fourth patterned nitride layer 180a. Then, referring to FIG. 2J. The gate material layer 170 is etched according to the pattern of the fourth patterned nitride layer 180a to form the gate 170a. After the gate 170a is formed, preferably the fourth patterned nitride layer 180a is removed. Thus, a gate structure whose line width approximately ranging between 10 nm-60 nm is formed.

Next, as indicated in step 309, ions are injected to the two sides of the channel 112 opposite to the gate 170a to form the first terminal 192 and the second terminal 194. Up to now, the main structure of the NAND memory array having vertical channel memory 100 is completed. The present embodiment of the invention is exemplified by the formation of a transistor with N-type channel, so N-type dopants are injected in the current step. If the transistor is designed to have P-type channel, then P-type dopants are injected.

Figure 4A:
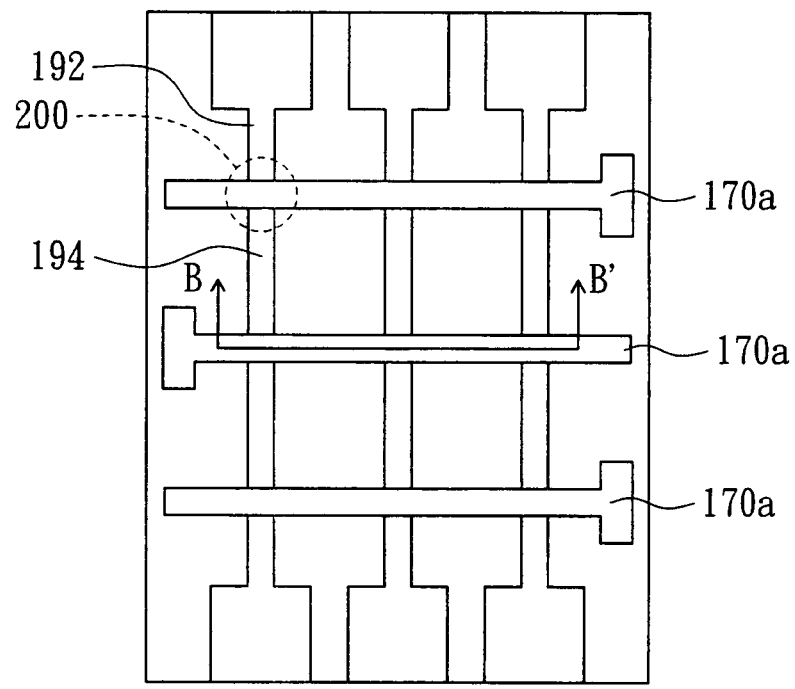
FIG. 4A is a top view of a vertical channel memory according to a second embodiment of the invention.
Figure 4B:
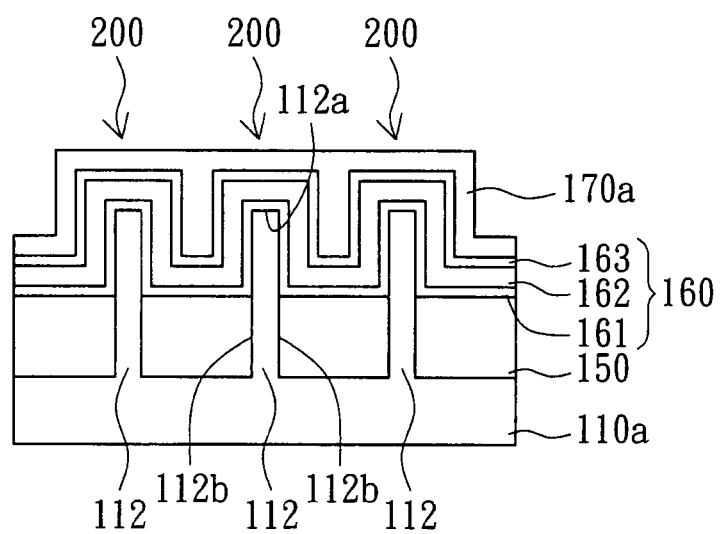
FIG. 4B is a cross-sectional view along a cross-sectional line BB' of FIG. 4A.

Second Embodiment to FIG. 4A and FIG. 4B. FIG. 4A is a top view of a vertical channel memory according to a second embodiment of the invention. FIG. 4B is a cross-sectional view along a cross-sectional line BB' of FIG. 4A. The vertical channel memory 200 of the present embodiment of the invention differs with the vertical channel memory 100 of the first embodiment in that the cap layer 140 is removed. As for other elements common to the vertical channel memory 100, the same numeric designations are used and the functions are not repeated here.

As the oxide layer 140 is removed, the top surface of the channel 112 capable of controlling the connection of current by the gate 170a is called a tri-gate structure.

The application of the present embodiment of the invention is exemplified below by the manufacturing process of the NAND memory array structure. Referring to FIGS. 5A-5J, perspectives illustrating the manufacturing process of the vertical channel memory according to the second embodiment of the invention are shown. Also referring to FIG. 6, a flowchart illustrating the manufacturing steps of the vertical channel memory according to the second embodiment of the invention is shown.

Figure 5A:
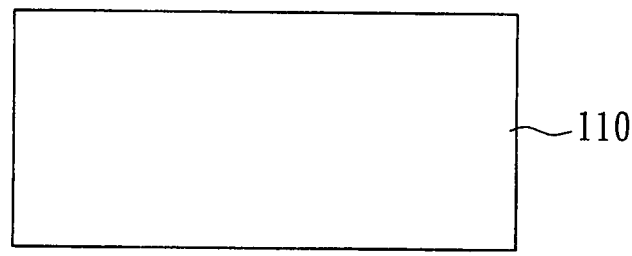
FIGS. 5A-5J illustrate the manufacturing process of the vertical channel memory according to the second embodiment of the invention.
Figure 6:
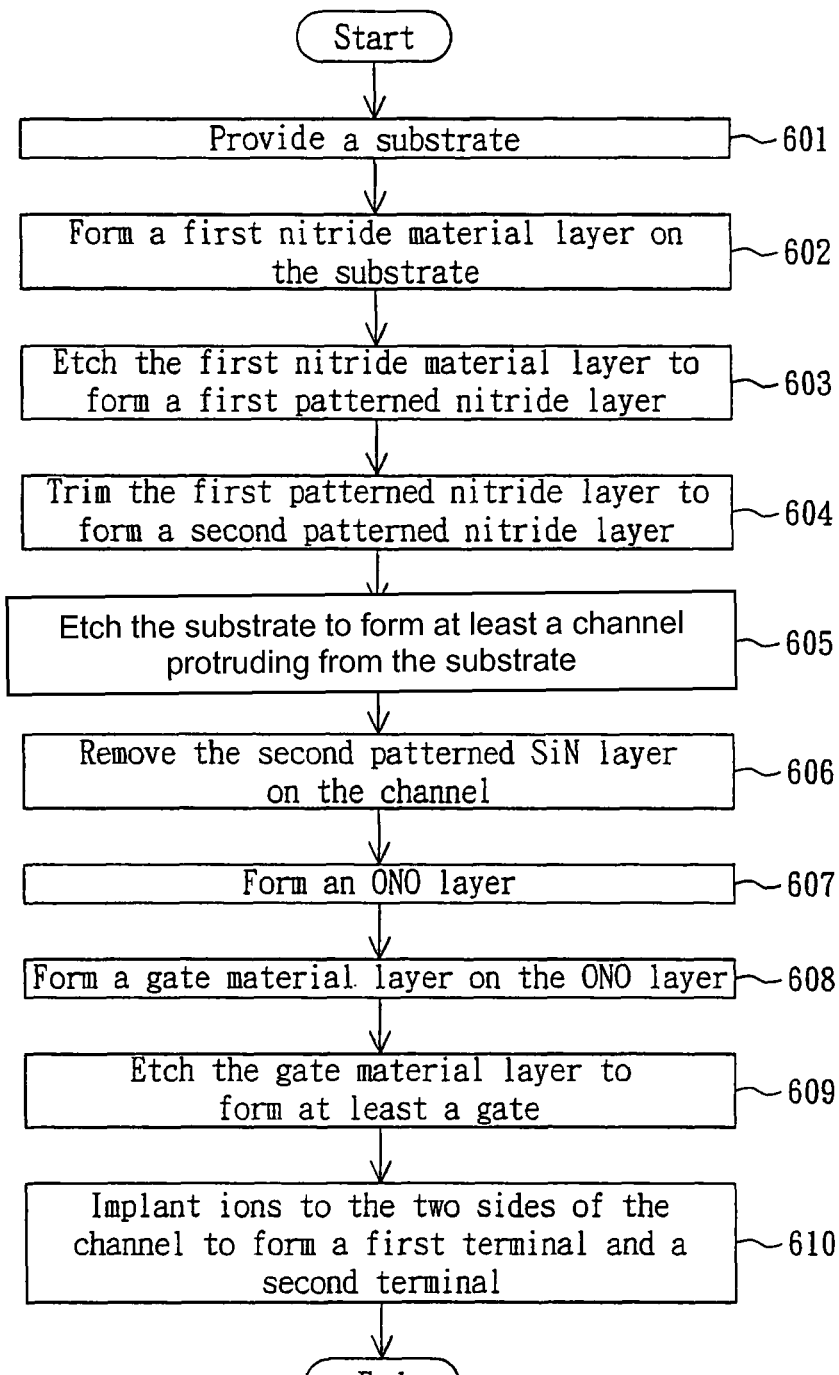
FIG. 6 is a flowchart illustrating the manufacturing steps of the vertical channel memory according to the second embodiment of the invention.

First, referring to FIG. 5A. As indicated in step 601, a substrate 110 is provided.

Figure 5B:
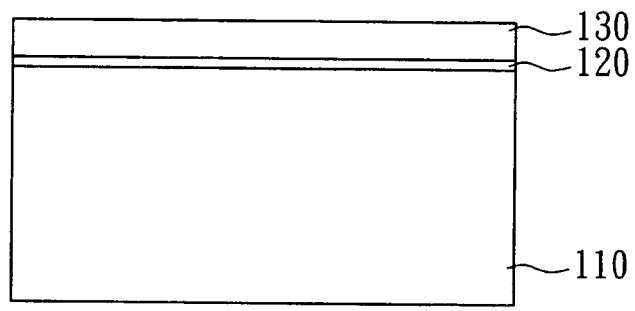

Next, referring to FIG. 5B. As indicated in step 602, a first nitride layer 130 is formed on the substrate 110. In the present embodiment of the invention, preferably a pad oxide layer 120 is formed between the substrate 110 and the first nitride layer 130. Furthermore, a transistor with N-type channel is formed in the present embodiment of the invention, so P-type ions are implanted to the substrate 110, such that the substrate 110 has better quality when forming a channel in subsequent process. However, the present embodiment of the invention is not limited thereto. If the transistor is designed to have P-type channel, then N-type ions are implanted to the substrate 100.

Figure 5C:
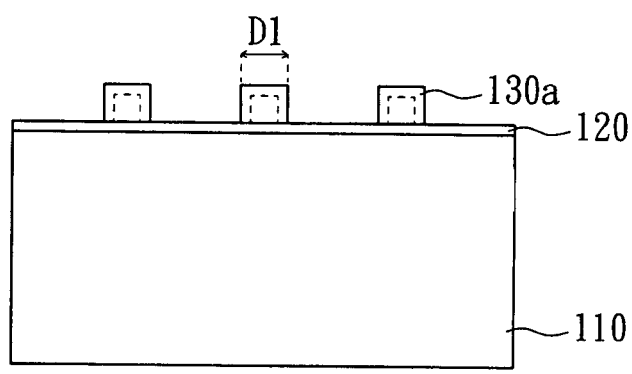

Then, referring to FIG. 5C. As indicated in step 603, the first nitride layer 130 is etched to form a first patterned nitride layer 130a. Step 603 includes the following substeps. The first patterned photo-resist layer (not illustrated) is formed on the first nitride layer 130. Next, the first nitride layer 130 is etched to form the first patterned nitride layer 130a. Then, the first patterned photo-resist layer is removed. The resulting first patterned nitride layer 130a has a pattern with line width D1.

Figure 5D:
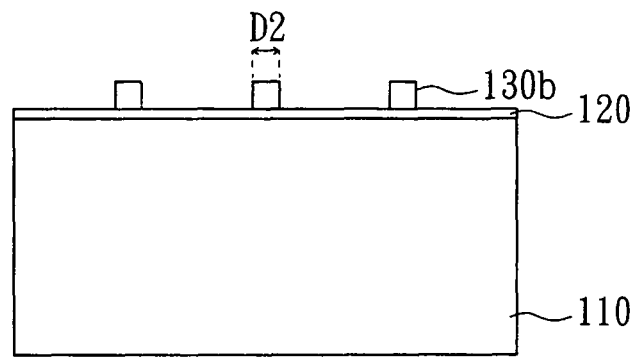

Next, referring to FIG. 5D. As indicated in step 604, the first patterned nitride layer 130a is trimmed to form a second patterned nitride layer 130b. The resulting second patterned nitride layer 130b after trimming has a pattern with line width D2 approximately ranging between 10 nm-60 nm.

Figure 5E:
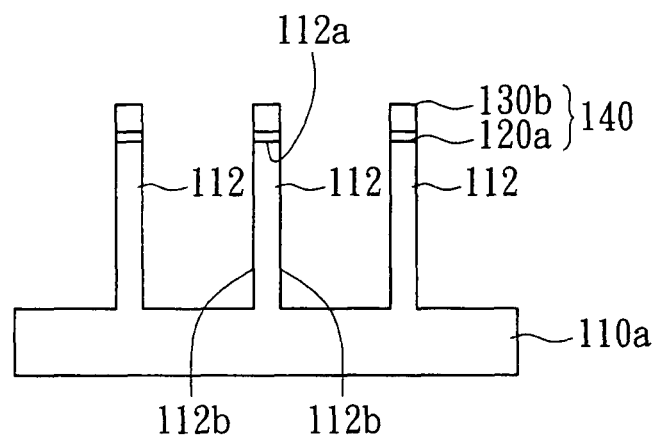

Then, referring to FIG. 5E. As indicated in step 605, the substrate 110 is etched to form a substrate 110a, and a channel 112 protruding from the substrate 110a. The channel 112 has a top surface 112a and two vertical surfaces 112b. In the present embodiment of the invention, preferably after the pad oxide layer 120 is etched to form pad oxide layer 120a according to the RIE method, the substrate 110 is subsequently etched to form a channel 112. Meanwhile, the pad oxide layer 120a and the second patterned nitride layer 130b as a whole are called a cap layer 140.

Figure 5F:
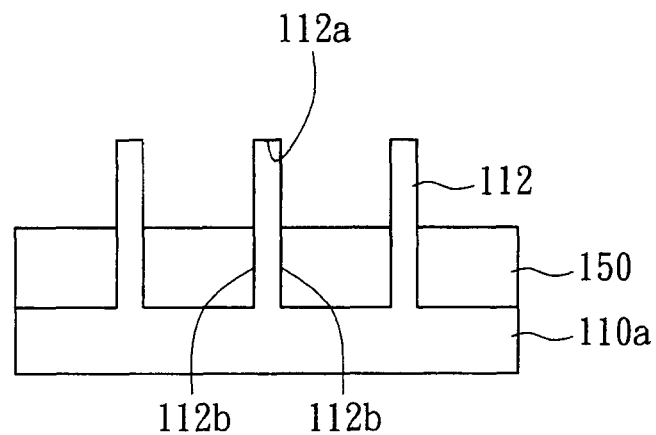

Next, referring to FIG. 5F. A thick oxide layer 150 avoids the substrate surface being electrically connected, hence generating leakage current. As indicated in step 606, on the channel 112, the cap layer 140 formed by the second patterned nitride layer 130b and pad oxide layer 120a is removed. The current step can be achieved by hot-phosphoric-acid ($H_3PO_4$). Meanwhile, preferably the pad oxide layer 120a is removed. The current step can be achieved by hydrofluoric acid (HF). The step of removing the second patterned nitride layer 130b and the pad oxide layer 120a can be performed either before or after the formation of the thick oxide layer 150.

Figure 5G:
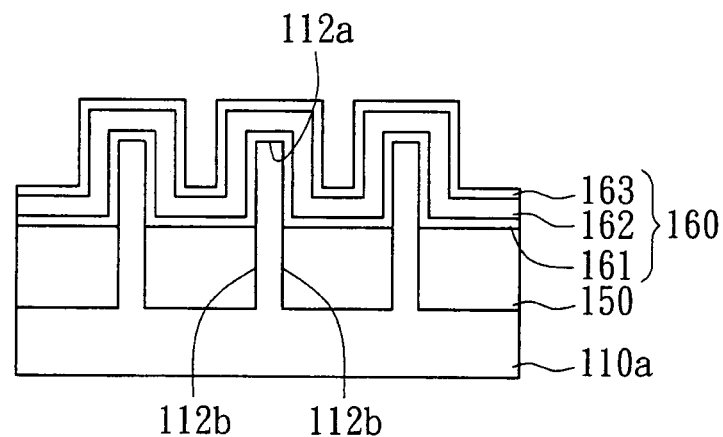

Then, referring to FIG. 5G. As indicated in step 607, an oxide-nitride-oxide (ONO) layer 160 is formed. The ONO layer 160 is disposed on two vertical surfaces 112b of the channel 112 and the thick oxide layer 150. The ONO layer 160 includes an oxide layer 161, a nitride layer 162 and an oxide layer 163. In the present embodiment of the invention, the nitride layer 162 uses silicon nitride as the charge trapping layer. However, the charge-trapping layer (nitride layer) 162 can also use aluminum oxide ($Al_2O_3$) or other materials with high dielectric constant.

Figure 5H:
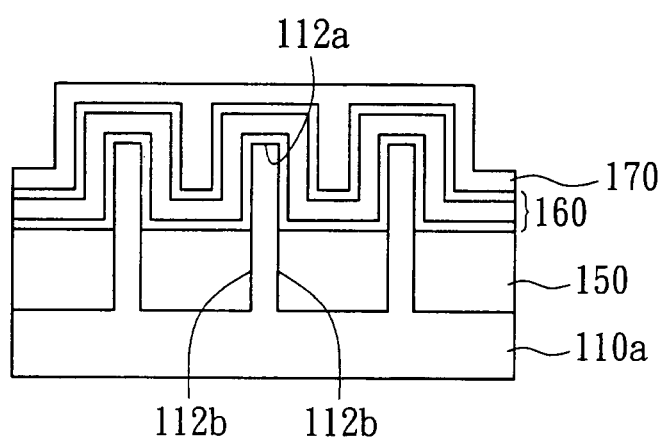

Next, referring to FIG. 5H. As indicated in step 608, a gate material layer 170 is formed on the ONO layer 160.

Figure 5I:
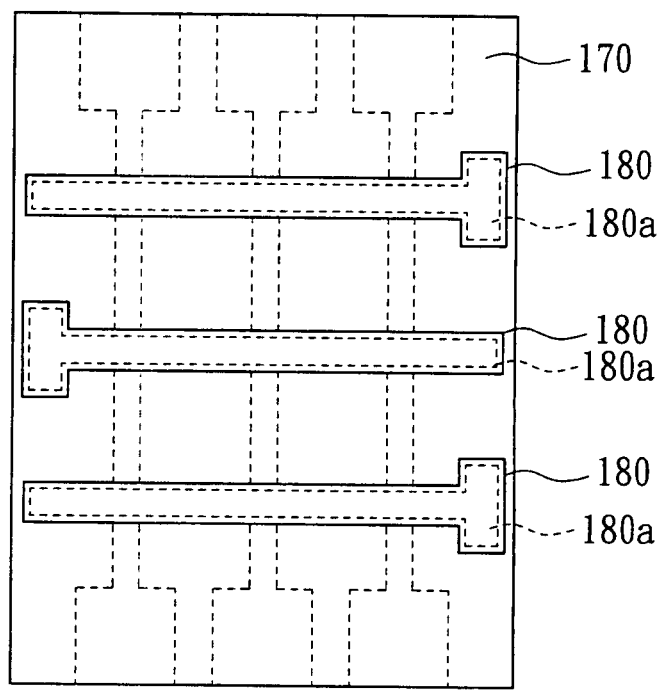
Figure 5J:
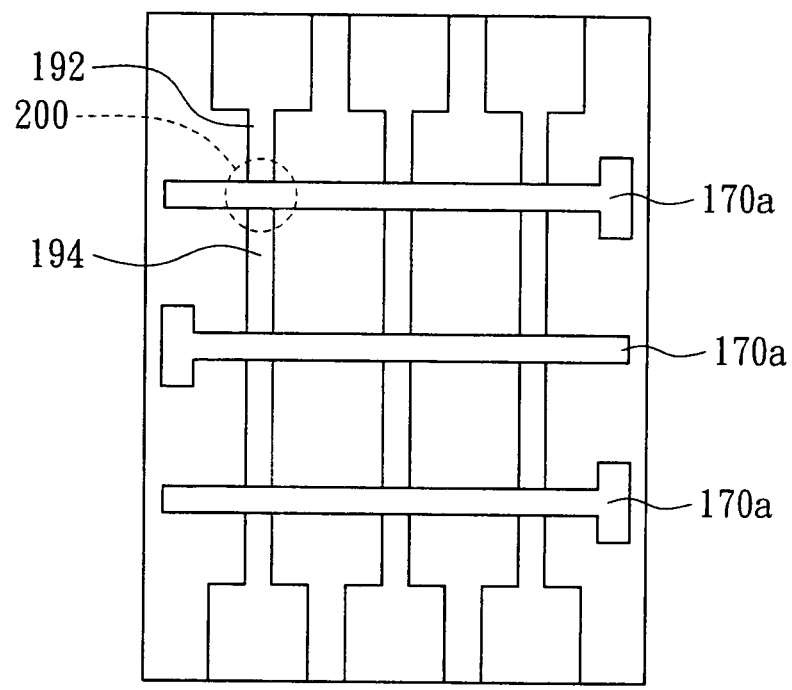

Then, referring to FIG. 5I. As indicated in step 609, the gate material layer 170 is etched to form at least a gate 170a positioned on two vertical surfaces 112b and the top surface 112a of the channel 112. Preferably, the following steps are performed before step 609. First, a second nitride layer (not illustrated) is formed on the gate material layer 170. Next, a second patterned photo-resist layer (not illustrated) is formed on the second nitride layer. Then, the second nitride layer is etched to form a third patterned nitride layer 180. Next, the second patterned photo-resist layer is removed. Then, the third patterned nitride layer 180 is trimmed to form a fourth patterned nitride layer 180a. Then, referring to FIG. 2J, the gate material layer 170 is etched according to the pattern of the fourth patterned nitride layer 180a to form the gate 170a. Preferably the step of removing the fourth patterned nitride layer 180a is included after the gate 170a is formed.

Next, as indicated in step 610, ions are injected on two sides of the channel 112 opposite to the gate 170a to form the first terminal 192 and the second terminal 194. Up to now, the main structure of the NAND memory array having vertical channel memory 200 is completed.

Third Embodiment

Figure 7A:
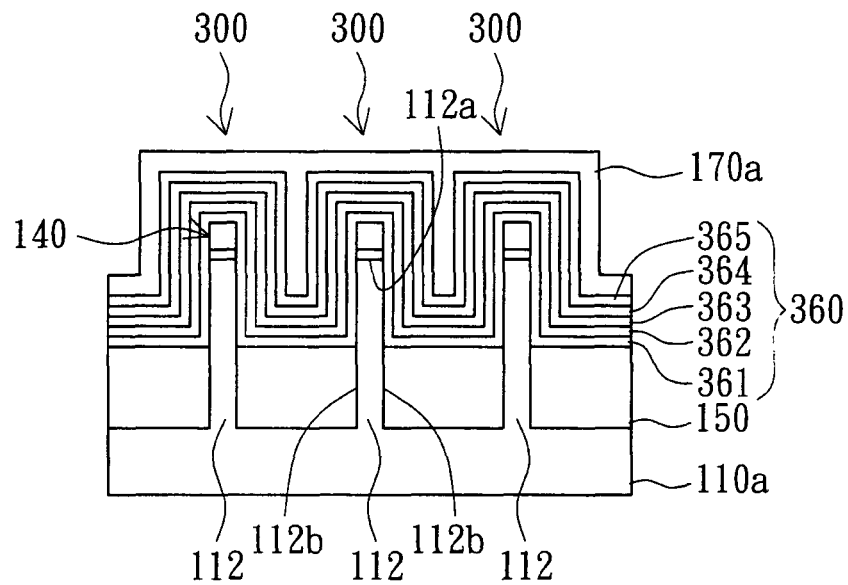
FIG. 7A is a sectional view of a first vertical channel memory according to a third embodiment of the invention.
Figure 7B:
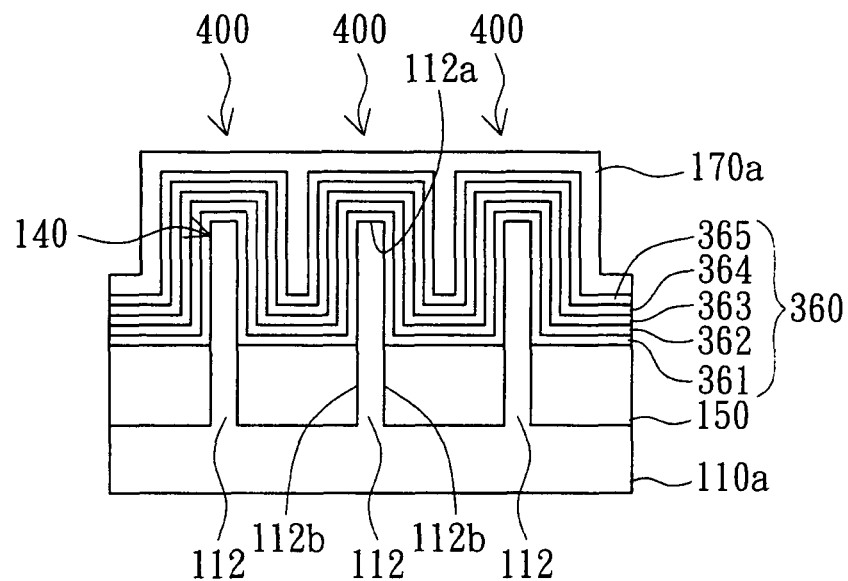
FIG. 7B is a sectional view of a second vertical channel memory according to the third embodiment of the invention.

Referring to FIG. 7A and FIG. 7B, FIG. 7A is a sectional view of a first vertical channel memory according to a third embodiment of the invention. FIG. 7B is a sectional view of a second vertical channel memory according to the third embodiment of the invention. The vertical channel memories 300 and 400 of the present embodiment of the invention differ with the vertical channel memory 100 of the first embodiment and the vertical channel memory 200 of the second embodiment in that the ONO layer 160 is replaced by an multi-layer structure including at least four layers, that is a barrier layer disposed on the channel 112, and a tunneling layer, a charge trapping layer and another barrier layer stacking sequently. In the third embodiment, the multi-layer structure has five layers, that is an ONONO layer 360 having a first barrier layer disposed on the channel 112, and a tunneling layer, a second barrier layer, a charge trapping layer and a third barrier layer stacking sequently, hence forming a memory with band gap engineered silicon-oxide-nitride-oxide-silicon (BE-SONOS) structure. As for other elements of the vertical channel memories 300 and 400 common to the vertical channel memory 100 and vertical channel memory 200, the same numeric designations are used and functions thereof are not repeated here.

The ONONO layer 360 includes an oxide layer 361 as the first barrier layer, a nitride layer 362 as the tunneling layer, an oxide layer 363 as the second barrier layer, a nitride layer 364 as the charge trapping layer and an oxide layer 365 as the third barrier layer. That is, the oxide layer 161 of the ONO layer 160 is replaced by the oxide layer 361, the nitride layer 362 and the oxide layer 363, hence resulting in even better operating characteristics. Besides, the nitride layer 362 can be replaced by a polysilicon layer as the tunneling layer. The nitride layer 364 of the ONONO layer 360 can be replaced by aluminum oxide or other materials with high dielectric constant as the charge trapping layer. The thickness of the first barrier layer, like oxide layer 361, is less than 20 angstrom (Å). The thickness of the first barrier layer preferably ranges between 5 Å-20 Å, or 10 Å-20 Å, or 10 Å-15 Å. Furthermore, the thickness of the first barrier layer is less than 15 Å. The thickness of the tunneling layer, like nitride layer 362, is less than 20 Å, and preferably ranges between 10 Å-20 Å. The thickness of the second barrier layer, like oxide layer 363, is less than 20 Å, and preferably ranges between 15 Å-20 Å.

Figure 8:
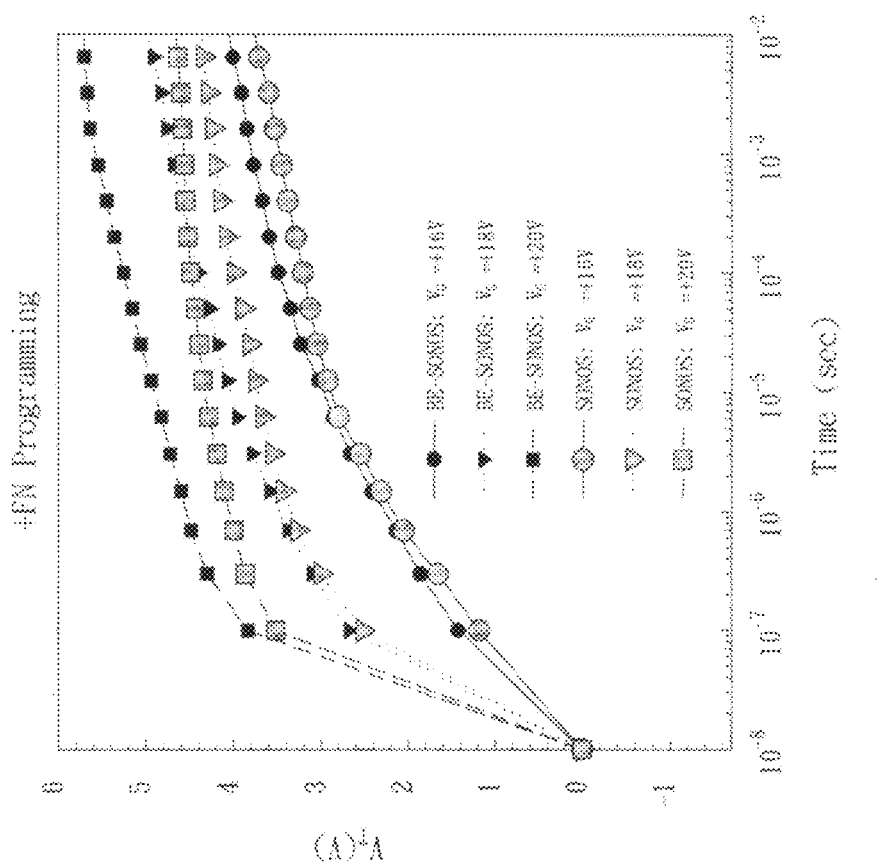
FIGS. 8-10 are graphs comparing various relationships.

FIG. 8 compares the relationship curve of threshold voltage vs. programming time between the vertical channel memory of the invention third embodiment and the conventional vertical channel memory. FIG. 8 compares the relationship curve of threshold voltage vs. erase time between the vertical channel memory of the third embodiment of the invention and the conventional vertical channel memory. As indicated in FIG. 8, when the same gate voltage VG is applied, the vertical channel memory with BE-SONOS structure of the present embodiment of the invention increases the threshold voltage faster than the vertical channel memory of conventional SONOS structure, hence resulting in much faster programming speed. As indicated in FIG. 9, when the same gate voltage VG is applied, the vertical channel memory with BE-SONOS structure of the present embodiment of the invention reduces the threshold voltage much faster than the vertical channel memory with conventional SONOS structure, hence resulting in much faster erase speed.

Figure 9:
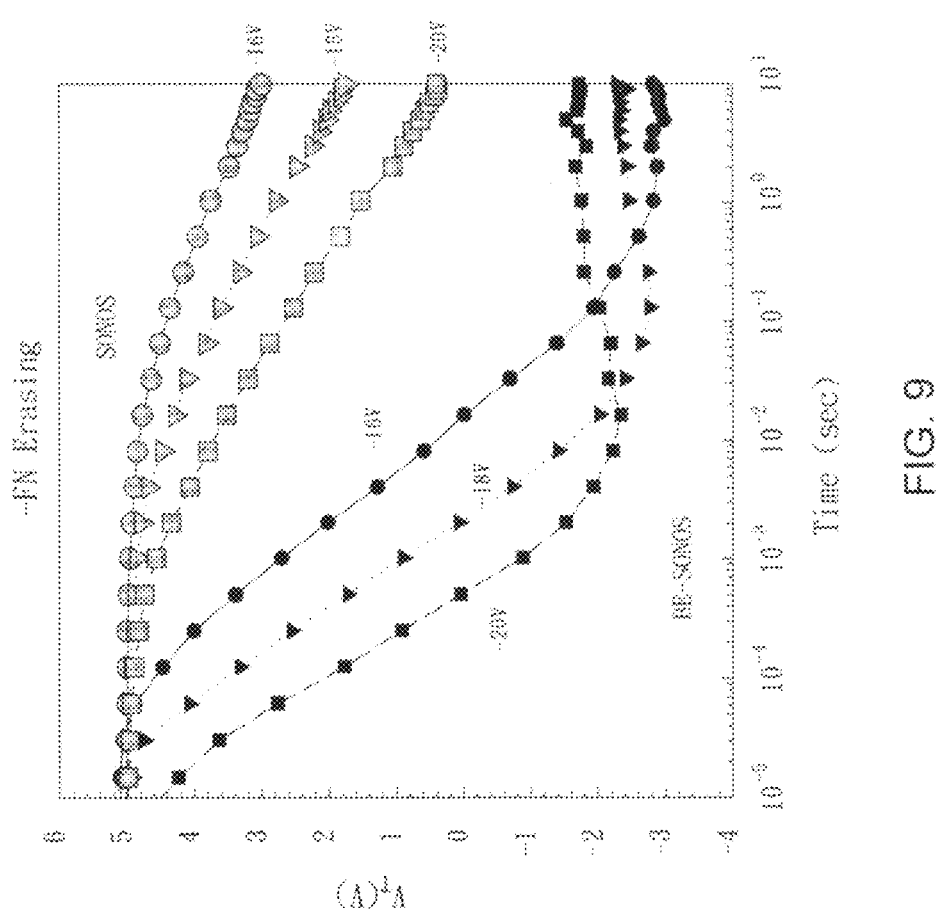

As indicated in FIG. 9, the vertical channel memory with BE-SONOS structure can be erased up to negative threshold voltage, hence largely increasing the range of operating window, and achieving the function of a multi-level cell (MLC) memory. When the BE-SONOS structure is used in an NAND memory array, as the threshold voltage can be negative during erasing, the channel can be inverted and turned on without applying extra bias-voltage to the gate, such that the operating procedures are simplified and power consumption is reduced.

Figure 10:
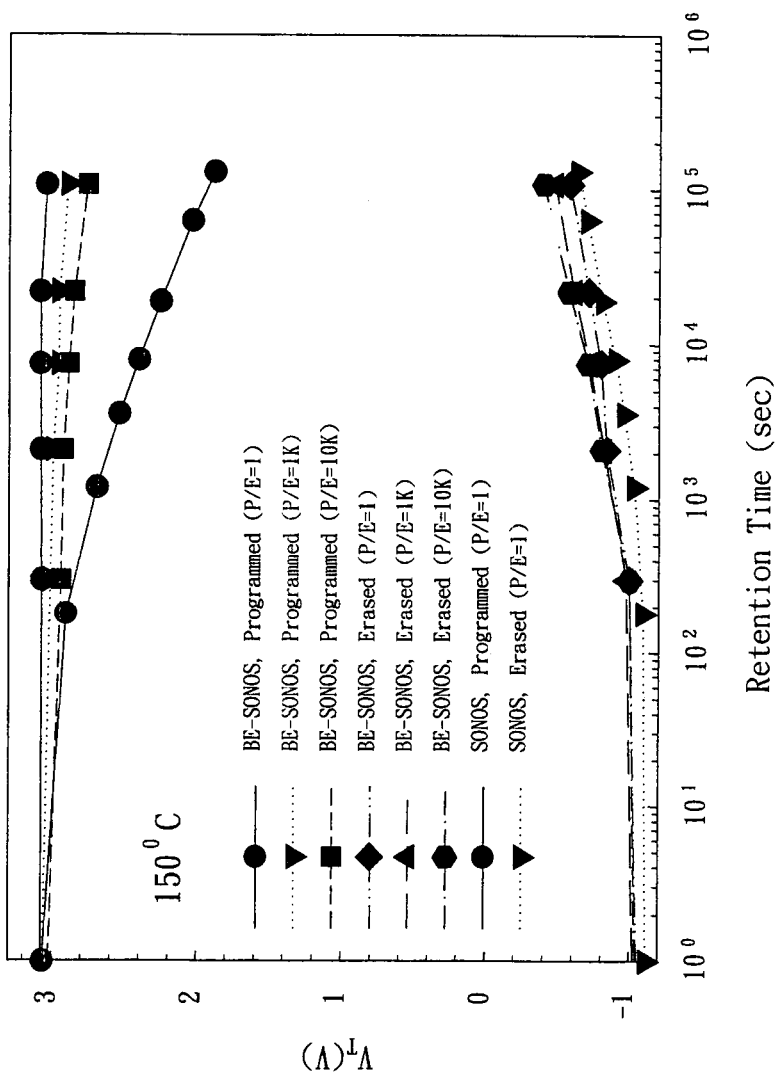

FIG. 10 compares the relationship curve of threshold voltage vs. retention time between the BE-SONOS vertical channel memory and the conventional SONOS vertical channel memory. As illustrated in FIG. 10, at 150° C. ambient temperature, the change of the threshold voltage of the BE-SONOS vertical channel memory and that of the conventional SONOS vertical channel memory under different programming-erasing cycles are shown. It can be seen that BE-SONOS vertical channel memory can maintain more stable threshold voltage, and especially perform excellent at high threshold voltage status.

Likewise, let the manufacturing process of the NAND memory array structure be taken for example. The manufacturing process of the vertical channel memories 300 and 400 of the present embodiment of the invention mainly differ with the manufacturing process of the vertical channel transistor structures 100 and 200 in the formation of the ONO layer 160 as in step 306 and step 607. In the present embodiment of the invention, the ONONO layer 360 is formed on the two vertical surfaces 112b of the channel 112 and the thick oxide layer 150. Other processes common to the first embodiment and the second embodiment are not repeated here.

As for the operating method of the vertical channel memory with BE-SONOS structure, the positive Fowler-Nordheim (+FN) operating method is adopted in programming data, that is, a first bias-voltage is applied to the gate 170a for programming the vertical channel memory 300 or 400, wherein the first bias-voltage is larger than 10V. On the other hand, the negative Fowler-Nordheim (−FN) operating method is adopted in erasing data, that is, a second bias-voltage whose electron is opposite to the first bias-voltage is applied to the gate 170a for erasing the vertical channel memory 300 or 400, wherein the second bias-voltage is more negative than −10V. Such operating method has the advantages of lowering operating current, reducing power consumption, avoiding the oxide layer 361 close to the channel being damaged, and increasing product reliability.

Moreover, the vertical channel memory with BE-SONOS structure is programmed according to channel hot electron injection (CHEI) method, that is, the vertical channel memory 300 or 400 is programmed by applying a first bias-voltage to the gate 170a, and a third bias-voltage whose polarity is the same as the first bias-voltage is applied to the first terminal 192 or the second terminal 194, wherein the first bias-voltage is larger than 7V, and the third bias-voltage is larger than 3.2V. Similarly, the vertical channel memory with BE-SONOS structure is erased according to the band-to-band hot hole (BTBHH) method, that is, the vertical channel memory 300 or 400 is erased by applying a second bias-voltage whose polarity is opposite to the first bias-voltage is applied to the gate 170a, and a fourth bias-voltage whose polarity is the same as the first bias-voltage is applied to the first terminal 192 or the second terminal 194, wherein the second bias-voltage negative, and the fourth bias-voltage is larger than 10.6V. As the nitride can trap the charge locally, the above operating method can achieve dual-bit memory by storing different bits in the portion of the ONONO layer 360 close to the source or the drain. In the present embodiment of the invention, the vertical channel memory with BE-SONOS structure is programmed according to channel hot electron injection (CHEI) method, and the vertical channel memory with BE-SONOS structure is erased according to the band-to-band hot hole (BTBHH) method, however the invention is not limited thereto. The vertical channel memory can be programmed according to the hole injection method and erased according to the electron injection method.

According to the vertical channel memory, the manufacturing method thereof and operating method using the same disclosed in the above embodiments of the invention, hot-phosphoric-acid is used to further reduce the line width of the pattern formed by nitride such that a vertical channel transistor structure whose channel width ranges between 10 nm~60 nm is manufactured without changing the pitch of the element formed by exposure. The invention effectively increases the driving current during programming or reading without incurring short channel effect or DIBL effect. The FinFET transistor formed thereby has small dimension, hence increasing memory density significantly. Therefore, without using an expensive exposure machine, a transistor structure having narrow channel can be manufactured according to the technology of the invention. The hard mask used in the invention adopts silicon nitride and resists the impact of ions better than conventional photo-resist layer, therefore the invention can etch and result in a uniform semiconductor element without increasing the thickness of the photo-resist layer. The vertical channel memory with BE-SONOS structure can locally trap the charge and can enlarge the range of the operating window to achieve an MLC memory. The operating method of +FN programming method and −FN erasing method have the advantages of lowering operating current, reducing power consumption, avoiding the bottom oxide layer close to the channel being damaged, and increasing product reliability.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a substrate including a plurality of ridge shaped semiconductor protrusions, a plurality of channels in the plurality of ridge shaped semiconductor protrusions, wherein the ridge shaped semiconductor protrusions have top surfaces and the channels have two vertical surfaces on the corresponding ridge shaped semiconductor protrusions;
a BE-SONOS multi-layer structure disposed over the plurality of ridge shaped semiconductor protrusions including on the top surfaces and the two vertical surfaces of the channels in the plurality of channels and over the substrate between the plurality of ridge shaped semiconductor protrusions, the multi-layer structure including a first barrier layer on the channel, a tunneling layer, a second barrier layer, a dielectric charge trapping layer storing data with one of at least a programmed state and an erased state, and a third barrier layer stacked sequentially; and
a plurality of gates over the multi-layer structure and positioned above the two vertical surfaces of the channels.

2. The memory device of claim 1, wherein first pad areas on the ends of each of the ridge shaped semiconductor protrusions are separate from second pad areas on the ends of each of the other ridge shaped semiconductor protrusions.

3. The memory device of claim 1, wherein the first barrier layer, the second barrier layer and the third barrier layer are oxide layers, the charge trapping layer is a nitride layer, and the tunneling layer is a nitride layer or a polysilicon layer.

4. The memory device of claim 1, wherein the thickness of the first barrier layer is less than 20 angstrom (Å).

5. The memory device of claim 1, wherein the thickness of the first barrier layer ranges between 5 Å-20 Å.

6. The memory device of claim 1, wherein the thickness of the first barrier layer is less than 15 Å.

7. The memory device of claim 1, wherein the thickness of the first barrier layer ranges between 10 Å-20 Å.

8. The memory device of claim 1, wherein the thickness of the first barrier layer ranges between 10 Å-15 Å.

9. The memory device of claim 1, wherein the thickness of the tunneling layer is less than 20 Å.

10. The memory device of claim 1, wherein the thickness of the tunneling layer ranges between 10 Å-20 Å.

11. The memory device of claim 1, wherein the thickness of the second barrier layer is less than 20 Å.

12. The memory device of claim 1, wherein the thickness of the second barrier layer ranges between 15 Å-20 Å.

13. The memory device of claim 1, further comprising a thick oxide layer positioned on the substrate between the ridge shaped semiconductor protrusions in the plurality of ridge shaped semiconductor protrusions, wherein the thick oxide layer contacts the two vertical surfaces of the channels.

14. The memory device of claim 1, further comprising a cap layer disposed on top surfaces of the plurality of channels, wherein the cap layer substantially has the same width as that of the ridge shaped semiconductor protrusions.

15. The memory device of claim 1, wherein the substrate is a bulk silicon substrate or a silicon on insulator (SOI) substrate.

16. The memory device of claim 1, wherein the material of the plurality of gates is N+ polysilicon, P+ polysilicon or metal.

17. The memory device of claim 1, wherein the line width of the channel approximately ranges between 10 nm-60 nm.

18. The memory device of claim 14, wherein the cap layer comprises a silicon dioxide ($SiO_2$) layer and a silicon nitride (SiN) layer, and the silicon nitride layer is positioned on the silicon dioxide layer, such that the cap layer avails the formation of the vertical channel memory.

19. The memory device of claim 18, wherein the cap layer has a first width before trimming of the silicon nitride (SiN) layer and has a second width after the trimming wherein the first width is wider than the second width.

20. A memory device, comprising:
a substrate including a plurality of ridge shaped semiconductor protrusions, a plurality of channels in the plurality of ridge shaped semiconductor protrusions, wherein the ridge shaped semiconductor protrusions have top surfaces and the channels have two vertical surfaces on the corresponding ridge shaped semiconductor protrusions;
a multi-layer structure disposed over the plurality of ridge shaped semiconductor protrusions including on the top surfaces and the two vertical surfaces of the channels in the plurality of channels and over the substrate between the plurality of ridge shaped semiconductor protrusions, the multi-layer structure including a first barrier layer on the channel, a tunneling layer having a thickness of less than 20 Å and being unable to store data with one of at least a programmed state and an erased state, a second barrier layer, a dielectric charge trapping layer and a third barrier layer stacked sequentially; and
a plurality of gates over the multi-layer structure and positioned above the two vertical surfaces of the channels.

* * * * *